US007285780B2

(12) United States Patent
Jaksch et al.

(10) Patent No.: US 7,285,780 B2
(45) Date of Patent: Oct. 23, 2007

(54) DETECTOR SYSTEM FOR A SCANNING ELECTRON MICROSCOPE AND A SCANNING ELECTRON MICROSCOPE INCORPORATING SAID DETECTOR SYSTEM

(75) Inventors: Heiner Jaksch, Heidenheim (DE); Johannes Bihr, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 11/327,315

(22) Filed: Jan. 9, 2006

(65) Prior Publication Data

US 2006/0163478 A1 Jul. 27, 2006

(30) Foreign Application Priority Data

Jul. 9, 2003 (DE) ................. 103 31 137

(51) Int. Cl.
*G21K 7/00* (2006.01)
(52) U.S. Cl. .................. 250/310; 250/397; 250/311; 250/396 R; 250/396 ML; 250/492.2; 250/505.1
(58) Field of Classification Search .................. None
See application file for complete search history.

(56) References Cited

U.S. PATENT DOCUMENTS 3,626,184 A 12/1971 Crewe 3,908,124 A 9/1975 Rose (Continued)

FOREIGN PATENT DOCUMENTS

EP 1 437 759 7/2004
JP 5234557 9/1993

(Continued)

OTHER PUBLICATIONS

Boulin, C. et al, "Parallel and Pipelined Front-End for Multi-element Silicon Detectors in Scanning Electron Microscopy", IEEE, Jun. 24, 1991, pp. 60 to 65.

(Continued)

*Primary Examiner*—Jack I. Berman
*Assistant Examiner*—Zia R. Hashmi
(74) *Attorney, Agent, or Firm*—Walter Ottesen

(57) ABSTRACT

With a detector system for the specimen chamber of a scanning electron microscope, signals are simultaneously detected in transmission which signals correspond to a light field contrast and a dark field contrast. The detector system (14) includes four detectors (15 to 18) in a plane (25) between which an aperture (19) for free access of electrons is located. Behind the aperture (19), a further detector (27) is arranged in a second plane (26). The detectors are preferably diodes. The detectors (15, 16, 17, 18) in the first plane (25), which is closer to the specimen, serve to generate signals which correspond to a dark field contrast. The further detector (27), more distant from the specimen, detects signals corresponding to a light field contrast. Large dead spaces, which are not sensitive to electrons, between the diodes and around the aperture (19), can be avoided by the offset arrangement of four diodes (15, 16, 17, 18) in the first plane (25).

31 Claims, 2 Drawing Sheets

U.S. PATENT DOCUMENTS

| | | |
|---|---|---|
| 4,308,457 A | 12/1981 | Reimer |
| 4,897,545 A | 1/1990 | Danilatos |
| 5,900,667 A | 5/1999 | Veneklasen et al. |
| 6,815,678 B2 | 11/2004 | Golla-Schindler et al. |

FOREIGN PATENT DOCUMENTS

| | | |
|---|---|---|
| JP | 06139988 | 5/1994 |
| JP | 10334846 | 12/1998 |

OTHER PUBLICATIONS

Pennycook, S.J. et al, "High Angle Dark Field STEM for Advanced Materials", J. Electron Microsc. (1996), vol. 45, No. 1, pp. 36 to 43.

Golla, U. et al. "Contrast in the transmission mode of a low-voltage scanning electron microscope", Journal of Microscopy, 1993, p. 219 to 225, vol. 173, Pt 3, The Royal Microscopial Society.

DETECTOR SYSTEM FOR A SCANNING ELECTRON MICROSCOPE AND A SCANNING ELECTRON MICROSCOPE INCORPORATING SAID DETECTOR SYSTEM

CROSS REFERENCE TO RELATED APPLICATIONS

This application claims priority of international patent application PCT/EP2004/006715, filed Jun. 22, 2004, and claiming priority from German patent application no. 103 31 137.8, filed Jul. 9, 2003, and the entire content of both applications is incorporated herein by reference.

FIELD OF THE INVENTION

The invention relates to a detector system for scanning electron microscopes, with which, in a scanning electron microscope, the electrons, which are transmitted through a specimen, or scattered electrons emanating from the specimen in transmission (that is, in the propagating direction of the primary electron beam), can be detected. Such so-called STEM units are accommodated in scanning electron microscopes in the specimen chamber below the specimen, that is, on the side of the specimen facing away from the electron source.

BACKGROUND OF THE INVENTION

A detector system of the above kind is, for example, described in the article of Ute Golla in the Journal of Microscopy, Volume 173 (1999), pages 219 to 225. A disadvantage in this known detector system is that only image information can be detected in the bright field contrast, that is, only electrons are detected which were scattered elastically at the specimen.

A further system for generating transmission images in a scanning electron microscope is described in U.S. Pat. No. 6,815,678. This system comprises a specimen holder or several specimen holders below which a diaphragm is mounted. This diaphragm is movable relative to the specimen holders. The electrons, which are transmitted through the diaphragm, are subsequently detected. Because of the relative shift between the diaphragm and the primary electron beam or the specimen, different contrasts can be generated, especially, image data can be recorded which corresponds to a bright field contrast, a dark field contrast or a mix thereof.

A detector system for an environmental scanning electron microscope (ESEM) is disclosed in U.S. Pat. No. 4,897,545. This electron microscope is designed for operation at a relatively high pressure in the specimen chamber. The detector system comprises several annularly-shaped and segmented electrodes. These detectors function to generate a direction-dependent topographical contrast of the specimen irradiated by the primary electron beam.

U.S. Pat. No. 3,908,124 discloses a scanning electron microscope which has below the specimen two detectors which are arranged offset to each other in the beam direction of the primary electron beam. The detector at the specimen side includes a central disc-shaped or decentral ring-shaped aperture. Electrons, which are transmitted through the specimen, or electrons, which are scattered by the specimen in the forward direction, can pass the detector at the specimen side through the aperture and impinge upon the second detector lying therebehind. An image datum can be generated via difference formation of the two detector signals which corresponds to a phase contrast.

SUMMARY OF THE INVENTION

It is an object of the invention to provide a detector system for scanning electron microscopes with which electrons, which are transmitted through the specimen or which emanate from the specimen in the forward direction, that is, in the propagation direction of the primary electron beam, can be detected and with which, simultaneously, the separate obtainment of image information is possible which corresponds to a bright field contrast and a dark field contrast. It is another object of the invention to provide a scanning electron microscope having the above detector. The detector should be so configured that a parallel detection of the x-ray radiation or a so-called EDX analysis is also not affected. The x-ray radiation is emitted on the primary electron side of the specimen.

The detector system of the invention is for a scanning electron microscope defining an optical axis along which an electron beam travels. The detector system includes: four electron detectors arranged in a first plane and being offset one with respect to the other so as to define an aperture between the electron detectors for a free passage therethrough of the electron beam; an additional detector arranged in a second plane spaced at a distance from the first plane; and, the additional detector being disposed in the second plane so as to be centered with respect to the aperture.

Thus, the detector system of the invention includes four first electron detectors which are arranged in a first plane. The four first electron detectors are arranged so as to be offset to each other in their plane so that an aperture is formed between the four detectors for a free passage of an electron beam. The detector system furthermore includes an additional electron detector which is arranged in a second plane centrally to the aperture between the four first electron detectors. The second plane is spaced at a distance to the first plane.

The scanning electron microscope of the invention defines an optical axis and includes: an electron source for emitting a beam of electrons in a direction of propagation along the optical axis toward a specimen having a side facing away from the electron source; an electron optic focusing the beam of electrons to irradiate the specimen with a focused electron beam causing a first group of the electrons to scatter at the specimen with no change or only a slight change in the direction of propagation and a second group of the electrons to scatter at the specimen with a change in propagation; a specimen chamber for holding the specimen; a detector system mounted in the specimen chamber downstream of the side of the specimen; the detector system having electron detector means in a first plane and the electron detector means defining an aperture to permit a free passage of the first group of the electrons; the detector system including an additional detector in a second plane spaced at a distance from the first plane; the additional detector being disposed downstream of the aperture viewed in the direction of propagation; the electron detector means being disposed at a distance from the specimen; and, the aperture having dimensions and the dimensions and the distance being so selected that the first group of electrons passes through the aperture and impinges upon the additional detector and the second group of electrons impinge upon the electron detector means.

When a corresponding detector system is so arranged on the side of a specimen (facing away from the electron source) in the specimen chamber of a scanning electron microscope that the illumination aperture of the primary electron beam just fills out the aperture between the four first electron detectors, the four first electron detectors detect exclusively electrons which were scattered at the specimen with a large change of direction and therefore contain image information which corresponds to a dark field contrast. The additional detector lies behind the first detectors and detects exclusively electrons which were scattered at the specimen without or with only a slight directional change and therefore contain image information which corresponds to a bright field contrast. Accordingly, the detector system makes possible the simultaneous recordation of image information corresponding to a bright field contrast and a dark field contrast. In this way, and without further specimen or detector manipulation, a switchover between bright field contrast and dark field contrast can take place. It is also possible to generate mixed forms of bright field and dark field contrasts via a corresponding signal processing.

The electron beam is additionally deflected by the scanning operation. The aperture between the first detectors is therefore designed somewhat larger than the diameter for the primary electron beam would require which diameter is determined by the illumination aperture. Usually, the scanning operation with STEM imaging takes place at medium and higher magnifications in the range of 1,000-times magnification or more. For this reason, the deflection of the primary electron beam lies only in the region of a few μm up to several 10 μm for a scanning operation in the specimen plane. Therefore, the aperture between the first detectors is to be designed only slightly greater than the diameter, which corresponds to the illumination aperture, so that even with a scanning operation, signals can be obtained which exhibit different contrasts.

The electron detectors are preferably configured as electron sensitive diodes. Four diodes form the four first electron detectors and they should have identical surfaces sensitive for electrons so that an identical detection sensitivity is ensured in radial direction about the primary electron beam.

The surfaces of the four first electron detectors, which are sensitive for electrons, as well as the surface of the second electron detector should all be directed to the side of the specimen facing away from the electron source.

The diameter or edge length of the additional electron detector, which is mounted in the second plane, should be greater than the diameter or the edge length of the aperture between the four first electron detectors in the first plane.

For the configuration of the electron detectors as diodes, the four diodes, which form the first four detectors, should each have rectangular or quadratic electron sensitive surfaces. The aperture, which is required for the free passage of the electrons, arises because of the corresponding offset arrangement of the four individual diodes. In this way, a very small aperture can be realized between the four detectors without too large a dead region (that is, a region insensitive for the electron detection) arising about the aperture and without large areas arising between the four first electron detectors which areas are insensitive for electrons.

The distance between the first and second plane should be between 0.1 and 5 mm. The aperture for the free passage of electrons between the four first detectors should have a diameter or an edge length between 0.05 and 1 mm.

The signal evaluation for the image signals, which are recorded with the detectors of the invention, should be switchable selectively between the following modes:

In a first mode, only the signal of the second lower detector is used for image generation/image display. The recorded image then corresponds to a bright field image. In a second mode, the signals of all four first detectors are added. The recorded image then corresponds to a dark field contrast. In a third mode, only the signals of individually selectable first electron detectors are applied for image generation. In a fourth mode, the signals, which are generated by two desired first detectors, are applied additively for image generation. These two modes correspond, respectively, to dark field image data having a direction selective effect. In a fifth mode, the added signals of all five detectors should be used for image generation. The image, which is then generated, corresponds to a mixed form of bright field and dark field contrasts. In addition to these described modes, it should be possible that the respective image signals be inverted in advance of the respective additions. This corresponds then to a subtraction of this detector signal from the other signal or the other signals.

It is especially advantageous to separately store the signals, which are detected by all five detectors, in dependence upon the deflection of the electron beam, for example, with the aid of five image storage cards. The selection of the suitable contrasts can then also be later changed and so selected that the desired image information can be best presented.

A scanning electron microscope of the invention includes an electron source and an electron optic for irradiating a specimen with a focused electron beam. In the specimen chamber of the scanning electron microscope, a detector system is mounted on the side of the specimen facing away from the electron source. This detector system has one or several detectors in a first plane wherein or between which an aperture is provided for a free passage of electrons. The detector system further includes a second detector in a second plane which is spaced from the first plane. The second detector, viewed in the propagation direction of the electrons coming from the electron source, is mounted behind the aperture of the detector or detectors in the first plane. The dimensions of the aperture for the free passage of the electrons in the detector or between the first detectors in the first plane are so selected that electrons, which are scattered at the specimen without significant directional change, pass through the aperture in the detector or between the detectors in the first plane and impinge upon the second detector. Accordingly, the electrons, which are scattered at the specimen with directional change, impinge upon the detectors in the first plane. The distance of the detector system and the diameter or the edge length of the aperture between the detectors in the first plane is then just so selected that the surface, which corresponds to the illumination aperture of the primary electron beam, in the plane of the detector system (more specifically, the area in the first plane wherein the first detectors are arranged) is smaller than the area of the aperture between the first detectors.

The detector system should be accommodated in the specimen chamber via a manipulator. With the aid of the manipulator, the detector system can be positioned for fine adjustment perpendicular to the optical axis of the electron beam so that the position of the aperture between the first detectors can be positioned centrally to the optical axis of the electron optics. With the aid of the manipulator, the detector system can be removed from the area of movement of the specimen table accommodated in the specimen chamber and can be repositioned with high precision in a predetermined position again centrally to the optical axis. In this way, a tilting of the specimen about the usually adjustable tilt angle is possible also for a detector system built into the specimen chamber so that the analytical possibilities, which are realizable with the electron microscope, are not limited.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
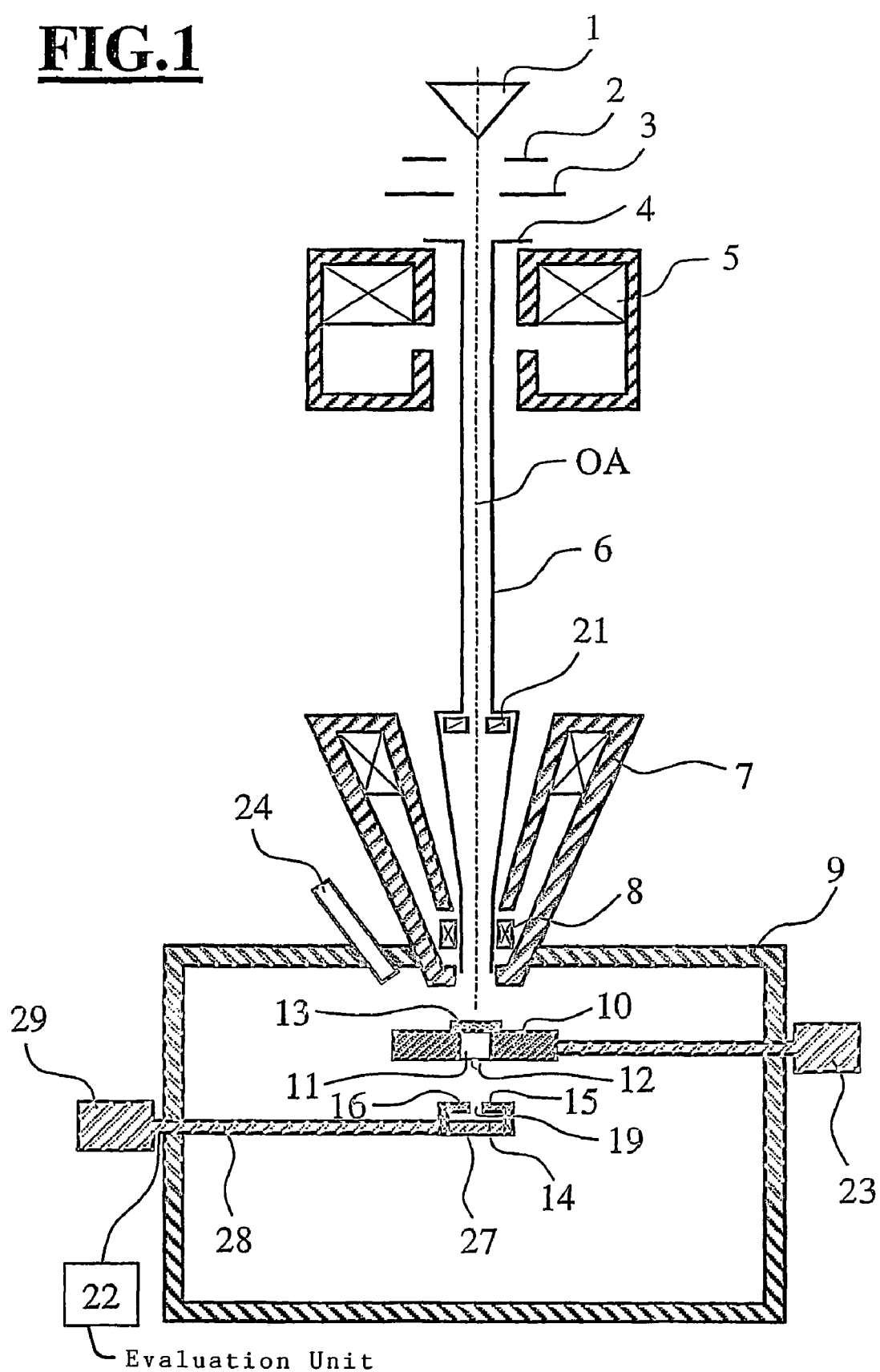
FIG. 1 is a section view through a scanning electron microscope having a detector system according to the invention within the specimen chamber.

In FIG. 1, reference numeral 1 identifies the electron source of the scanning electron microscope. The electron source 1 is preferably a field emission source or a so-called Schottky emitter having a suppressor electrode 2 and an extractor electrode 3. With the aid of the extractor electrode 3 and of the potential applied thereto, electrons are emitted from the emitter 1 and the electron flow is controlled. The electrons are accelerated to their desired energy by the potential applied to an anode 4.

A magnetic condenser lens 5 follows the electron beam generator (1 to 4) for adjusting the aperture of the electron beam.

The scanning electron microscope includes a magnetic objective lens 7 via which the electron beam is focused. The coils of a magnetic deflecting system 8 are arranged within the pole shoe gap of the magnetic lens 7. With the deflecting system 8, the electron beam is deflectable perpendicular to the optical axis OA in order to scan a specimen 13.

In the embodiment shown in FIG. 1, a beam guide tube 6 is provided which extends from the anode 4 through the bores through the condenser lens 5 and the objective lens and only ends at the elevation of the pole shoe gap of the magnetic lens 7 or at the specimen side thereof. Depending upon the potential charge between the anode 4 and the magnetic lens 7 and the specimen holder 10, which is accommodated in the specimen chamber 9, the beam guidance tube forms an additional electrostatic lens with the pole shoe edge of the magnetic lens 7 at the specimen side via which the electrons are braked from the column potential to the desired target energy with which the primary electrons impinge upon the specimen 13 accommodated on the specimen holder 10.

A specimen holder 10 is accommodated in a manner known per se in the specimen chamber 9 of the scanning electron microscope with the specimen holder 10 having a central bore 11. The specimen holder 10 can be finely positioned in the three mutually perpendicular spatial directions in a manner known per se by means of a manipulator 23 operator-controllable from outside of the specimen chamber. The specimen holder 10 is also tiltable about a tilt axis 12 perpendicular to the optical axis OA. In addition, the specimen holder is rotatable about an axis parallel to the optical axis OA.

An in-lens detector 21 is arranged within the beam guide tube 6 above the objective lens 7 (that is, facing toward the source). Secondary electrons, which are released from the specimen by the primary electron beam, can be detected via the in-lens detector 21. For this purpose, the secondary electrons, which emanate from the specimen, are drawn through the electrostatic immersion lens, which is formed by the beam guide tube 6, into the beam guide tube and are accelerated to the potential of the beam guide tube.

The detector system 14 of the invention is arranged on the side of the specimen holder 10 facing away from the electron source 1. The detector system 14 is also accommodated via a manipulator 28, which can be operated via an operator-controlled element 29 from outside of the specimen chamber, and can be positioned in the plane perpendicular to the optical axis OA in two mutually perpendicular directions and in the direction of the optical axis OA.

The detector system includes four diodes (15, 16) which are arranged in a plane. Only two of the diodes are shown in FIG. 1 and a quadratic hole 19 is disposed between these diodes. Furthermore, the detector system includes a further diode 27 in a second plane offset from the plane of the four first diodes (15, 16) in the direction of the optical axis. The additional diode 27 overlaps the hole between the first detectors (15, 16) and detects those electrons which pass through the hole between the first diodes (15, 16).

The signals, which are detected by the individual diodes (15, 16, 27), are guided out from the specimen chamber 9 via signal leads (not shown in FIG. 1) integrated into the manipulator rod 28 and supplied to the signal processing unit 22.

An x-ray detector 24 for EDX analyses is accommodated on the side of the objective lens 7 through a further port of the specimen chamber 9. The detector system of the invention is completely arranged on the side of the specimen holder 10 facing away from the objective lens 7. For this reason, x-ray analyses with the EDX detector 24 can also be carried out simultaneously with the obtainment of signals with the detector system of the invention.

Figure 2:
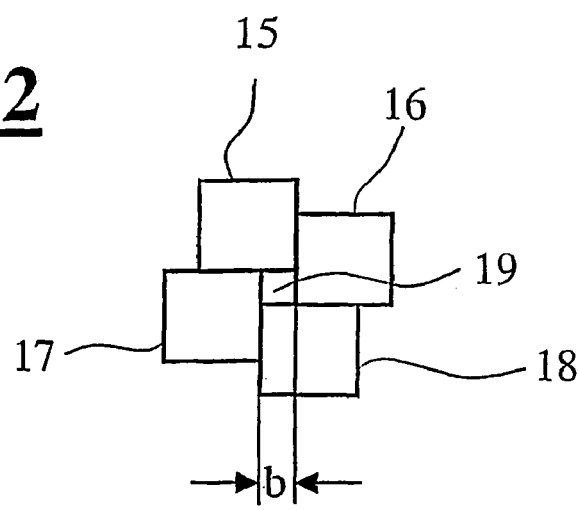
FIG. 2 is a plan view of the detector system of the invention.

In the plan view of FIG. 2, the four diodes (15, 16, 17, 18) arranged in the first plane are so shown that one can view the electron sensitive surfaces thereon. The electron sensitive surfaces of the diodes (15, 16, 17, 18) face toward the specimen holder 10 (FIG. 1) in the built-in detector system.

All four diodes (15, 16, 17, 18) have identical quadratic or rectangular electron sensitive surfaces. The four diodes (15, 16, 17, 18) are each arranged slightly offset to each other so that a quadratic aperture 19 is formed between the four diodes (15, 16, 17, 18). The offset between these diodes (15, 16, 17, 18) is in the direction of the edges of the diodes which border on each other. Apart from the desired quadratic aperture 19 in the center between the four diodes (15, 16, 17, 18), the diodes are arranged to border directly on one another so that no dead regions, which are insensitive for electrons, occur between the diodes (15, 16, 17, 18). The offset between the diodes (15, 16, 17, 18) is less than 1 mm, preferably less than 400 µm and especially preferably approximately 200 µm so that the quadratic aperture has an edge length (b) corresponding to the offset between the diodes.

Figure 3:
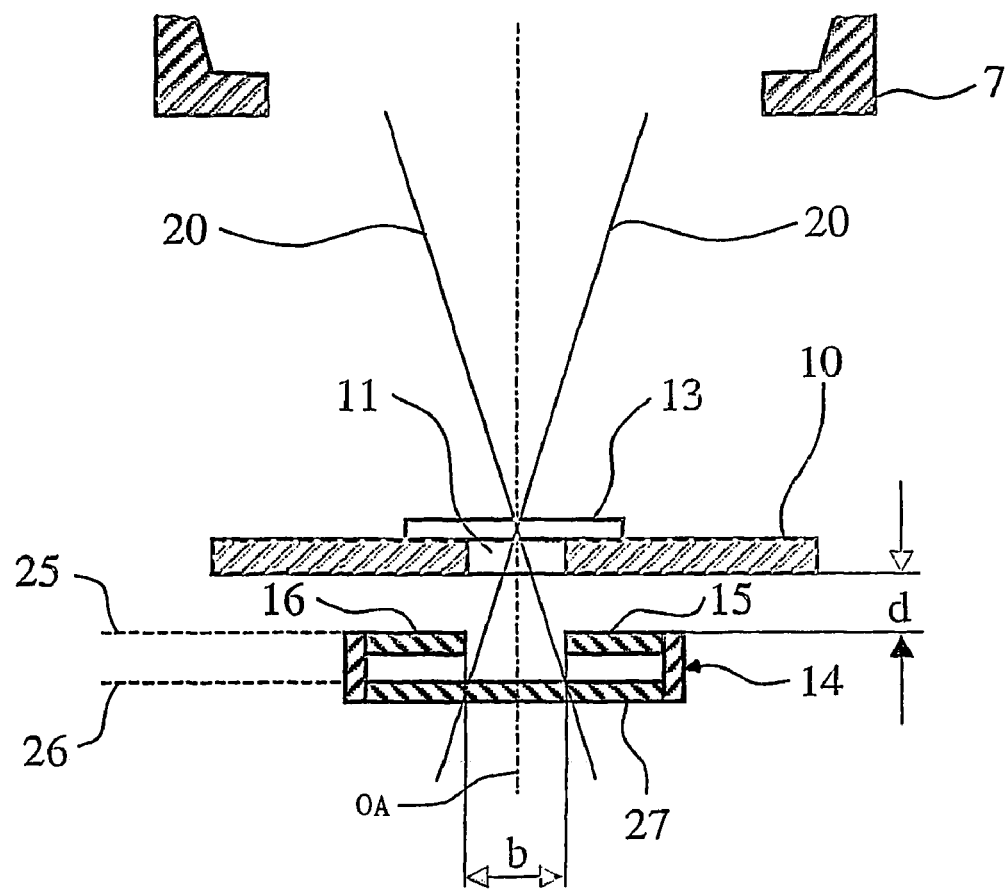
FIG. 3 is an enlarged view of the specimen region in the specimen chamber of a scanning electron microscope having a detector system according to the invention.

As can be seen from the enlarged presentation in FIG. 3, the distance (d) between the specimen holder 10 and the detector system 14 is selected in dependence upon the edge length of the aperture 19 between the detectors (15, 16) in the first plane 25 so that the electrons, which are scattered at the specimen 13 with a slight change in their direction of movement and which have passed the specimen 13 in transmission, pass through the aperture 19 between the detectors (15, 16) in the first plane 25 and impinge on the further detector 27 which is arranged in the second plane 26. The distance (d) between the specimen holder 10 and the detector system 14 is so selected in dependence upon the edge length (b) of the aperture 19 and the illumination aperture that the area corresponding to the illumination aperture 20 in the first plane almost corresponds to the area of the aperture 19. Electrons, which are scattered at the specimen with a significant change of their direction of movement in the forward direction, impinge on the detectors 15 to 18 arranged in the first plane 25. The electrons, which are scattered at the specimen without or only with a slight change of their propagation direction, pass the aperture 19 and impinge on the additional detector 27 arranged in the second plane 26.

The signal evaluation unit 22 includes respective image storage cards for all five independent detectors (15 to 18, 27) or respective storage regions on a correspondingly large single image storage card so that simultaneously the signals, which are detected with each individual detector, are detected in each scanning position of the primary electron beam and are stored. The signal evaluation unit 22 then permits the image presentation in five different modes for which all information is present almost directly so that there can be a change between the different modes without complex intermediate image processing. In a first image mode, only the signal of the further detector 27 is applied for image generation whereby the illustrated image exhibits a bright field contrast. In a second mode, the sum of the signals of the four first detectors (15 to 18) is applied for image generation whereby the illustrated image corresponds to a dark field contrast. In a third and a fourth mode, selectable signals of only a single detector (15, 16) of the detectors (15 to 18) arranged in the first plane 25 or the sum of the signals of two detectors (15, 16) arranged in the first plane are applied for image generation whereby the image contains a dark field contrast having different directional selective effects. This corresponds in crystals to an orientation contrast. In a fifth mode, the sum of the signals of all detectors 15 to 18, which are arranged in the first plane, and of the detector 27, which is arranged in the second plane 26, are applied for image generation whereby the image contains a mixed form of a bright field contrast and a dark field contrast. Additionally, the output signals of any desired detectors can be inverted, so that, in addition to the formation of the sum, also the difference formation and the presentation with inverted contrasts is possible.

It is understood that the foregoing description is that of the preferred embodiments of the invention and that various changes and modifications may be made thereto without departing from the spirit and scope of the invention as defined in the appended claims.

What is claimed is:

1. A detector system for a scanning electron microscope defining an optical axis along which an electron beam travels, the detector system comprising:
    four electron detectors arranged in a first plane and being offset one with respect to the other so as to define an aperture between said electron detectors for a free passage therethrough of said electron beam;
    an additional detector arranged in a second plane spaced at a distance from said first plane; and,
    said additional detector being disposed in said second plane so as to be centered with respect to said aperture.

2. The detector system of claim 1, wherein said four detectors have respective identical surfaces sensitive to electrons.

3. The detector system of claim 1, wherein said four electron detectors have respective rectangular or quadratic surfaces sensitive to electrons.

4. The detector system of claim 1, wherein said aperture is quadratic.

5. The detector system of claim 1, wherein said distance lies in a range between 0.1 mm and 5 mm.

6. The detector system of claim 1, wherein said aperture has a diameter or edge length between 0.05 mm and 1 mm.

7. The detector system of claim 1, wherein said electron detectors are diodes.

8. The detector system of claim 1, further comprising a signal evaluation unit for selectively applying one of the following for generating an image:
    (a) the individual detector signals of selected ones of said four detectors in said first plane;
    (b) the sum of the detector signals of said four detectors in said first plane; and,
    (c) the detector signal of said additional detector.

9. A scanning electron microscope defining an optical axis and comprising:
    an electron source for emitting a beam of electrons in a direction of propagation along said optical axis toward a specimen having a side facing away from said electron source;
    an electron optic focusing said beam of electrons to irradiate said specimen with a focused electron beam causing a first group of said electrons to scatter at said specimen with no change or only a slight change in the direction of propagation and a second group of said electrons to scatter at said specimen with a change in propagation;
    a specimen chamber for holding said specimen;
    a detector system mounted in said specimen chamber downstream of said side of said specimen;
    said detector system having electron detector means in a first plane and said electron detector means defining an aperture to permit a free passage of said first group of said electrons;
    said detector system including an additional detector in a second plane spaced at a distance from said first plane;
    said additional detector being disposed downstream of said aperture viewed in said direction of propagation;
    said electron detector means being disposed at a distance from said specimen; and,
    said aperture having dimensions and said dimensions and said distance being so selected that said first group of electrons passes through said aperture and impinges upon said additional detector and said second group of electrons impinges upon said electron detector means.

10. The scanning electron microscope of claim 9, further comprising a manipulator accommodated in said specimen chamber; and, said manipulator being adjustable in two mutually perpendicular directions in a plane perpendicular to said optical axis.

11. The scanning electron microscope of claim 10, further comprising a specimen table disposed in said specimen chamber and said specimen table being movable in a region within said specimen chamber; and, said manipulator being movable out of said region and being repositionable with high precision to a previous preset position.

12. The scanning electron microscope of claim 9, wherein said electron detector means comprises four electron detectors arranged in said first plane and conjointly defining said aperture.

13. The scanning electron microscope of claim 12, said electron detectors having respective identical surfaces sensitive to electrons.

14. The scanning electron microscope of claim 13, wherein said electron detectors are diodes.

15. The scanning electron microscope of claim 12, wherein said aperture has a diameter or edge length of less than 1 mm.

16. The scanning electron microscope of claim 12, wherein said four electron detectors have surfaces sensitive to electrons; said surfaces border directly on each other outside of said aperture so that regions insensitive to electrons arise between said electron detectors and have dimensions of less than 200 µm perpendicular to the edges of the detectors.

17. The scanning electron microscope of claim 12, further comprising a signal evaluation unit for providing an image generation in at least five modes; namely:
   (a) in a first mode, by applying only the signal of said additional detector for said image generation;
   (b) in a second mode, by applying the sum of the signals of said electron detectors for said image generation;
   (c) in a third mode, by applying selectable signals of individual ones of said electron detectors for said image generation;
   (d) in a fourth mode, by applying the sum of the signals of two of said electron detectors for said image generation; or,
   (e) in a fifth mode, by applying the sum of the signals of said electron detectors and of the signal of said additional detector for said image generation.

18. A detector system for a scanning electron microscope defining an optical axis along which an electron beam travels, the detector system comprising:
   four electron detectors arranged in a first plane and being offset one with respect to the other so as to define a quadratic aperture between said electron detectors for a free passage therethrough of said electron beam;
   said four electron detectors having respective rectangular or quadratic surfaces sensitive to electrons;
   an additional detector arranged in a second plane spaced at a distance from said first plane; and,
   said additional detector being disposed in said second plane so as to be centered with respect to said aperture.

19. The detector system of claim 18, wherein said four detectors have respective identical surfaces sensitive to electrons.

20. The detector system of claim 18, wherein said distance lies in a range between 0.1 mm and 5 mm.

21. The detector system of claim 18, wherein said aperture has a diameter or edge length between 0.05 mm and 1 mm.

22. The detector system of claim 18, wherein said electron detectors are diodes.

23. The detector system of claim 18, further comprising a signal evaluation unit for selectively applying one of the following for generating an image:
   (a) the individual detector signals of selected ones of said four detectors in said first plane;
   (b) the sum of the detector signals of said four detectors in said first plane; and,
   (c) the detector signal of said additional detector.

24. A scanning electron microscope defining an optical axis and comprising:
   an electron source for emitting a beam of electrons in a direction of propagation along said optical axis toward a specimen having a side facing away from said electron source;
   an electron optic focusing said beam of electrons to irradiate said specimen with a focused electron beam causing a first group of said electrons to scatter at said specimen with no change or only a slight change in the direction of propagation and a second group of said electrons to scatter at said specimen with a change in propagation;
   a specimen chamber for holding said specimen;
   a detector system mounted in said specimen chamber downstream of said side of said specimen;
   said detector system including four electron detectors in a first plane;
   said four electron detectors having respective rectangular or quadratic surfaces sensitive to electrons and conjointly defining a quadratic aperture to permit a free passage of said first group of said electrons;
   said detector system including an additional detector in a second plane spaced at a distance from said first plane;
   said additional detector being disposed downstream of said aperture viewed in said direction of propagation;
   said electron detector means being disposed at a distance from said specimen; and,
   said aperture having dimensions and said dimensions and said distance being so selected that said first group of electrons passes through said aperture and impinges upon said additional detector and said second group of electrons impinges upon said electron detector means.

25. The scanning electron microscope of claim 24, further comprising a manipulator accommodated in said specimen chamber; and, said manipulator being adjustable in two mutually perpendicular directions in a plane perpendicular to said optical axis.

26. The scanning electron microscope of claim 25, further comprising a specimen table disposed in said specimen chamber and said specimen table being movable in a region within said specimen chamber; and, said manipulator being movable out of said region and being repositionable with high precision to a previous preset position.

27. The scanning electron microscope of claim 24, wherein said electron detector means comprises four electron detectors arranged in said first plane and conjointly defining said aperture.

28. The scanning electron microscope of claim 27, said electron detectors having respective identical surfaces sensitive to electrons.

29. The scanning electron microscope of claim 28, wherein said electron detectors are diodes.

30. The scanning electron microscope of claim 27, wherein said aperture has a diameter or edge length of less than 1 mm.

31. The scanning electron microscope of claim 27, wherein said four electron detectors have surfaces sensitive to electrons; said surfaces border directly on each other outside of said aperture so that regions insensitive to electrons arise between said electron detectors and have dimensions of less than 200 µm perpendicular to the edges of the detectors.

* * * * *